United States Patent
Que

(10) Patent No.: US 9,678,398 B2
(45) Date of Patent: Jun. 13, 2017

(54) STRUCTURE AND METHOD FOR OBTAINING CAPACITANCE IN ARRAY SUBSTRATE

(71) Applicant: Shenzhen China Star Optoelectronics Technology Co., Ltd., Shenzhen, Guangdong (CN)

(72) Inventor: Xiangdeng Que, Guangdong (CN)

(73) Assignee: Shenzhen China Star Optoelectronics Technology, Co., Ltd., Shenzhen, Guangdong (CN)

(*) Notice: Subject to any disclaimer, the term of this patent is extended or adjusted under 35 U.S.C. 154(b) by 0 days.

(21) Appl. No.: 14/418,604

(22) PCT Filed: Jan. 14, 2015

(86) PCT No.: PCT/CN2015/070692
§ 371 (c)(1),
(2) Date: May 9, 2016

(87) PCT Pub. No.: WO2016/106850
PCT Pub. Date: Jul. 7, 2016

(65) Prior Publication Data
US 2016/0246141 A1    Aug. 25, 2016

(30) Foreign Application Priority Data
Dec. 31, 2014 (CN) .......................... 2014 1 0855647

(51) Int. Cl.
*G02F 1/1362* (2006.01)
*G01R 27/26* (2006.01)
(Continued)

(52) U.S. Cl.
CPC ....... *G02F 1/136213* (2013.01); *G01R 27/26* (2013.01); *H01L 27/1255* (2013.01);
(Continued)

(58) Field of Classification Search
None
See application file for complete search history.

(56) References Cited

U.S. PATENT DOCUMENTS

| 2002/0079920 A1* | 6/2002 | Fujikawa | G02F 1/1309 324/754.07 |
|---|---|---|---|
| 2004/0100287 A1 | 5/2004 | Taquchi | |
| 2006/0279321 A1 | 12/2006 | Ruppender et al. | |

FOREIGN PATENT DOCUMENTS

| CN | 1743858 A | 3/2006 |
|---|---|---|
| CN | 1773442 A | 5/2006 |

(Continued)

OTHER PUBLICATIONS

International Search Report and Written Opinion, Jan. 14, 2015, China.

*Primary Examiner* — Angel Roman
*Assistant Examiner* — Kevin Quinto
(74) *Attorney, Agent, or Firm* — Kim Winston LLP

(57) ABSTRACT

A structure and a method for obtaining capacitance in an array substrate are disclosed. The structure comprises a first conductive region, arranged in a same layer as a first conductive layer of said array substrate; a second conductive region, arranged in a same layer as a second conductive layer of said array substrate, wherein said second conductive region overlaps with said first conductive region partly or totally; a first measurement region, connected with said first conductive region; and a second measurement region, connected with said second conductive region. The capacitance of the corresponding capacitor of the sub pixel can be detected by the structure, thereby providing data basis for judging the performance and quality of the sub pixel and the liquid crystal display panel.

18 Claims, 2 Drawing Sheets

(51) Int. Cl.
*H01L 27/12* (2006.01)
*H01L 49/02* (2006.01)
(52) U.S. Cl.
CPC .......... *H01L 27/1259* (2013.01); *H01L 28/60* (2013.01); *G02F 2001/136254* (2013.01)

(56) References Cited

FOREIGN PATENT DOCUMENTS

| CN | 101140744 A | 3/2008 |
| JP | 2001051620 A | 2/2001 |

\* cited by examiner

STRUCTURE AND METHOD FOR OBTAINING CAPACITANCE IN ARRAY SUBSTRATE

CROSS REFERENCE TO RELATED APPLICATION

The present application claims benefit of Chinese patent application CN 201410855647.2, entitled "Structure and Method for Obtaining Capacitance in Array Substrate" and filed on Dec. 31, 2014, which is incorporated herein by reference.

FIELD OF THE INVENTION

The present disclosure relates to the technical field of liquid crystal display, and particularly to a structure and a method for obtaining capacitance in an array substrate.

BACKGROUND OF THE INVENTION

With the advantages of high image quality, small volume, light weight, low driving voltage and low power consumption, the liquid crystal display devices have been widely used in various IT digital products, such as car navigation systems, engineering workstations, monitors, portable information terminals, electronic terminals, electronic books, laptops, and large-sized direct-viewing televisions of flat panel.

The traditional liquid crystal display panel mainly comprises a thin film transistor array substrate, a color filter substrate, and a liquid crystal layer that is arranged between the above two substrates. However, the resolution of this kind of display panel is poor, and the aperture ratio thereof is low. Moreover, a positioning error would occur when the color filter substrate is aligned with the thin film transistor array substrate.

In recent years, the technology that the color filter layer is integrated directly into the thin film transistor array substrate (Color Filter on Array, i.e., COA) has been developed. As shown in FIG. 1, the liquid crystal display panel that is produced through the COA technology mainly comprises a COA substrate 101, an opposite substrate 102, and a liquid crystal layer 103 arranged therebetween. The COA substrate 101 comprises a glass substrate 104, a silicon nitride insulation layer 105, a capacitor electrode 106, a first silicon nitride passivation protection layer 107, a color filter layer 108, a second silicon nitride passivation protection layer 109, and a pixel electrode 110. Since the color filter layer 108 is integrated into the COA substrate 101, the opposite substrate 102 comprises no color filter layer. In the COA technology, the color filter layer is directly formed on the thin film transistor array substrate, and therefore, the positioning error, which would otherwise be caused when the color filter substrate is aligned with the thin film transistor array substrate of the traditional liquid crystal display panel, would not occur. Moreover, the resolution and the aperture ratio of the liquid crystal display panel can both be improved through COA technology.

In the COA substrate, the color filter layer 108 is arranged between the capacitor electrode 106 and the pixel electrode 110. However, since the dielectric constant of the color filter layer would change with temperature, a capacitance of a storage capacitor that is formed by a storage electrode and a pixel electrode is not stable. Consequently, during the manufacturing of the COA substrate, the capacitance of the storage capacitor cannot meet the requirement thereof. Therefore, a device through which the capacitance of the storage capacitor of the array substrate can be obtained during manufacturing process is needed.

SUMMARY OF THE INVENTION

The present disclosure aims to solve the technical problem of how to obtain capacitance in an array substrate. In order to solve the aforesaid technical problem, the embodiment of the present disclosure first provides a structure for obtaining capacitance in an array substrate, comprising:

a first conductive region, arranged in a same layer as a first conductive layer of said array substrate;

a second conductive region, arranged in a same layer as a second conductive layer of said array substrate, wherein said second conductive region overlaps with said first conductive region partly or totally;

a first measurement region, connected with said first conductive region; and a second measurement region, connected with said second conductive region.

According to one embodiment of the present disclosure, said first conductive layer is a conductive layer where a capacitor electrode is arranged and said second conductive layer is a conductive layer where a pixel electrode is arranged.

According to one embodiment of the present disclosure, said first conductive layer is a conductive layer where a common electrode is arranged and said second conductive layer is a conductive layer where a pixel electrode is arranged.

According to one embodiment of the present disclosure, said first measurement region and said first conductive region are arranged in a same layer, and/or said second measurement region and said second conductive region are arranged in a same layer.

According to one embodiment of the present disclosure, said second measurement region is arranged in a same layer as said first measurement region and connected with said second conductive region through a via hole.

According to one embodiment of the present disclosure, said first conductive region and/or said second conductive region have/has a round shape.

According to one embodiment of the present disclosure, said first measurement region and said second measurement region have a same geometric dimension.

According to one embodiment of the present disclosure, said first measurement region and said second measurement region are separated from each other by a pre-determined distance.

According to one embodiment of the present disclosure, a first matching network is arranged between said first conductive region and said first measurement region; and/or a second matching network is arranged between said second conductive region and said second measurement region.

The present disclosure further provides a method for obtaining capacitance in an array substrate, comprising the following steps:

forming the structure as mentioned in any one of the above items on said array substrate;

obtaining a capacitance of a capacitor that is formed by the first conductive region and the second conductive region of said structure through measuring the first measurement region and the second measurement region of said structure; and obtaining a capacitance of a capacitor that is formed by a pixel electrode and a common electrode or a capacitor electrode of a sub pixel through calculation according to the capacitance obtained in the above step and an overlapped area of the first conductive region and the second conductive region, as well as an overlapped area of the pixel electrode and the common electrode or the capacitor electrode of said sub pixel in the array substrate.

The structure provided by the present disclosure is the same as a structure of a corresponding part of the sub pixel in the array substrate, such as a structure formed by the pixel electrode and the common electrode of the sub pixel, a structure formed by the pixel electrode and the capacitor electrode of the sub pixel or the like. Therefore, when the capacitance of the capacitor that is formed by the structure is obtained through measurement, the capacitance of the corresponding capacitor of the sub pixel can be obtained according to a plate area (i.e., an overlapped area of the first conductive region and the second conductive region) of the capacitor that is formed by the structure, and a plate area (i.e., an overlapped area of the pixel electrode and the common electrode of the sub pixel, or an overlapped area of the pixel electrode and the capacitor electrode of the sub pixel) of the corresponding capacitor of the sub pixel. In this case, the capacitance of the corresponding capacitor of the sub pixel can be detected, thereby providing data basis for judging the quality of the sub pixel and that of the liquid crystal display panel.

According to the method for obtaining capacitance in an array substrate provided by the present disclosure, the structure which is the same as the structure of the sub pixel in the array substrate is formed on a pre-determined position of the liquid crystal display panel, whereby the capacitance of the capacitor of the corresponding part of the sub pixel can be determined through measuring the capacitance of the capacitor that is formed by the structure. The measurement of the capacitance of the capacitor of the sub pixel in the liquid crystal display panel can be realized through the method, thereby providing data basis for analyzing the performance parameters and production status of the liquid crystal display panel.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

The drawings necessary for explaining the embodiments or the prior art are introduced briefly below to illustrate the technical solutions of the embodiments of the present disclosure or the prior art more clearly.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

Many specific details are illustrated hereinafter for providing a thorough understanding of the embodiments of the present disclosure. However, it is obvious for those skilled in the art that, the present disclosure can be implemented in other methods in addition to the details or specifics described herein.

Figure 1:
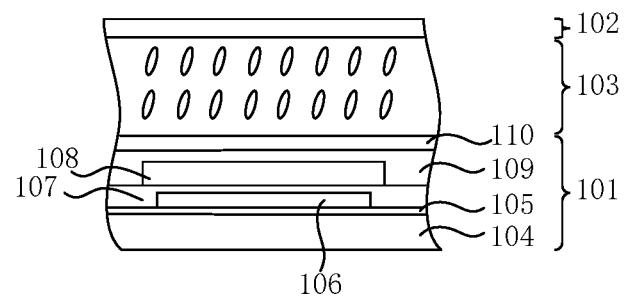
FIG. 1 is a structural diagram of a liquid crystal display panel based on COA technology.
Figure 2:
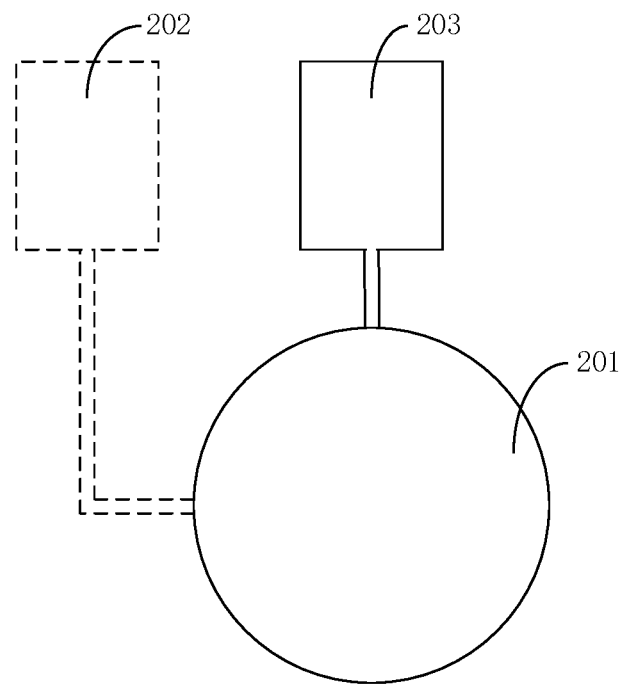
FIG. 2 schematically shows a structure according to one embodiment of the present disclosure.

FIG. 2 schematically shows a structure for obtaining capacitance in an array substrate according to the present embodiment.

Figure 3:
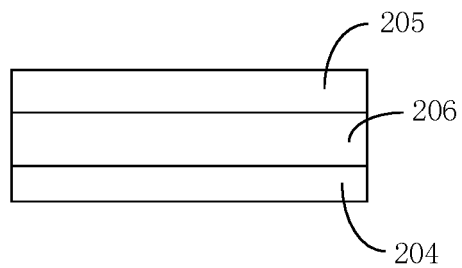
FIG. 3 schematically shows a first region of the structure as shown in FIG. 2.

As shown in FIG. 2, the structure provided by the present embodiment comprises a region 201, a first measurement region 202, and a second measurement region 203. As shown by the structural diagram of the region 201 in FIG. 3, the region 201 of the structure provided by the present embodiment comprises a first conductive region 204 and a second conductive region 205. The structure provided by the present embodiment is the same as a structure of a corresponding part of the sub pixel in the array substrate. That is, the first conductive region 204 of the structure is arranged in a same layer as a capacitor electrode of the array substrate, the second conductive region 205 is arranged in a same layer as a pixel electrode of the array substrate, and a color filter layer 206 and a passivation protection layer are arranged between the first conductive region 204 and the second conductive region 205.

According to the present embodiment, the first conductive region 204 and the second conductive region 205 overlap with each other totally. That is, the first conductive region 204 and the second conductive region 205 are arranged in the same position of different material layers of the array substrate and have a same geometric dimension. As a result, a plate area of a capacitor that is formed by the first conductive region 204 and the second conductive region 205 is equal to the area of the first conductive region 204 or the area of the second conductive region 205.

It should be noted that, according to other embodiments of the present disclosure, the first conductive region 204 and the second conductive region 205 can overlap with each other partly. In this case, the plate area of the capacitor that is formed by the first conductive region 204 and the second conductive region 205 is equal to an area of an overlapped part of the first conductive region 204 and the second conductive region 205.

According to the present embodiment, the first conductive region 204 and the second conductive region 205 both have a round shape with a diameter of 500 µm. The round shape of the first conductive region 204 and the second conductive region 205 can reduce the deformation thereof during machining process effectively, so that the stability of the conductive regions can be improved. However, according to other embodiments of the present disclosure, the diameter of the first conductive region 204 and/or the second conductive region 205 can be other reasonable values, such as values in a range from 300 µm to 700 µm. In addition, the two regions can have other reasonable shapes, such as rectangle, polygon, and the like. The present disclosure is not limited by this.

The first measurement region 202 is connected with the first conductive region 204, and the second measurement region 203 is connected with the second conductive region 205. Therefore, the capacitance of the capacitor that is formed by the first conductive region 204 and the second conductive region 205 can be measured through detecting the first measurement region 202 and the second measurement region 203 with a probe.

Since in the traditional producing technology, the thickness of the metal layer where the pixel electrode is arranged is relatively small, if the second measurement region of the structure is arranged in the same layer as the pixel electrode, the second measurement region would be easily broken by the probe when measuring the capacitance thereof, and thus the structure is broken as well. By contrast, the thickness of the metal layer where the capacitor electrode is arranged is relatively large, which would not be broken by the probe easily. Therefore, according to the present embodiment, the first measurement region 202 and the second measurement region 203 are both arranged in the same layer as the capacitor electrode, and the second measurement region 203 is connected with the second conductive region 205 through a via hole. In this case, it can be guaranteed that, when the probe is applied to the first measurement region 202 and the second measurement region 203, the two measurement regions are not broken. Hence, the reliability of the capacitor electrode and the accuracy of the measurement result can both be ensured.

In order to facilitate the applying of the probe, according to the present embodiment, the first measurement region 202 and the second measurement region 203 of the structure are not covered by any other non-conductive medium on the above side (i.e., the direction near to the liquid crystal layer).

Of course, according to other embodiments of the present disclosure, if the physical strength of the metal layer in which the pixel electrode is arranged can ensure that the metal layer cannot be broken by the probe easily, the first measurement region and/or the second measurement region can also be arranged in the same layer as the pixel electrode. The present disclosure is not limited by this.

According to the present embodiment, the first measurement region 202 and the second measurement region 203 both have a rectangular shape with a length of 300 μm and a width of 200 μm, and are separated from each other by a distance of 200 μm. The first measurement region 202 and the second measurement region 203 have the same shape and geometric dimension, and therefore, the influence on the measurement result generated by the different geometric dimensions thereof can be reduced. The first measurement region 202 and the second measurement region 203 are separated from each other by a certain distance. In this manner, the interference therebetween can be reduced, and the accuracy of the measurement result of the capacitor can be ensured.

According to the present embodiment, a corresponding matching network is arranged between the first measurement region 202 and the first conductive region 204, and a corresponding matching network is arranged between the second measurement region 203 and the second conductive region 205. The influence on the measurement result generated by the metal wirings can be reduced by the matching networks, and thus the accuracy of the measurement result can be further improved.

Of course, according to other embodiments of the present disclosure, the first conductive region can also be arranged in the same layer as the common electrode in the array substrate. In this case, the liquid crystal layer is arranged between the first conductive region and the second conductive region. The present disclosure is not limited by this.

It can be seen from the above description that, the structure provided by the present embodiment is the same as a structure of a corresponding part of the sub pixel in the array substrate, such as a structure formed by the pixel electrode and the common electrode of the sub pixel, a structure formed by the pixel electrode and the capacitor electrode of the sub pixel or the like. Therefore, when the capacitance of the capacitor that is formed by the structure is obtained through measurement, the capacitance of the corresponding capacitor of the sub pixel can be obtained according to a plate area (i.e., an overlapped area of the first conductive region and the second conductive region) of the capacitor that is formed by the structure, and a plate area (i.e., an overlapped area of the pixel electrode and the common electrode of the sub pixel, or an overlapped area of the pixel electrode and the capacitor electrode of the sub pixel) of the corresponding capacitor of the sub pixel. In this case, the capacitance of the corresponding capacitor of the sub pixel can be detected, thereby providing data basis for judging the quality of the sub pixel and that of the liquid crystal display panel.

Figure 4:
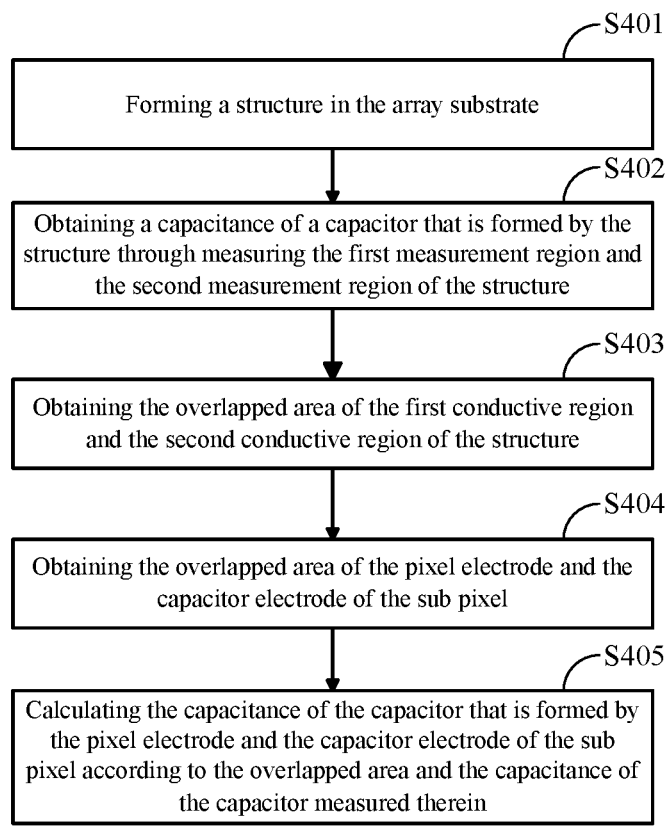
FIG. 4 is a flow chart of a method for obtaining capacitance in an array substrate according to one embodiment of the present disclosure.

The present disclosure further provides a method for obtaining capacitance in an array substrate taking advantage of the aforesaid structure. According to the present embodiment, the capacitance of the storage capacitor that is formed by the pixel electrode and the capacitor electrode of the array substrate can be obtained through the method. FIG. 4 is a flow chart of the method.

As shown in FIG. 4, according to the method provided by the present embodiment, in step S401, a structure is firstly formed in the array substrate. The structure comprises a first conductive region that is arranged in the same layer as the capacitor electrode of the array substrate, a second conductive region that is arranged in the same layer as the pixel electrode of the array substrate, and a first measurement region and a second measurement region that are both arranged in the same layer as the first conductive region. Since the thickness of the metal layer where the pixel electrode is arranged is relatively small, if the second measurement region of the structure is arranged in the same layer as the pixel electrode, the second measurement region would be easily broken by the probe when measuring the capacitance thereof, and thus the structure is broken as well. By contrast, the thickness of the metal layer where the capacitor electrode is arranged is relatively large, which would not be broken by the probe easily. Therefore, according to the present embodiment, the first measurement region and the second measurement region are both arranged in the same layer as the capacitor electrode and are bare.

Of course, according to other embodiments of the present disclosure, if the physical strength of the metal layer in which the pixel electrode is arranged can ensure that the metal layer cannot be broken by the probe easily, the first measurement region and/or the second measurement region can also be arranged in the same layer as the pixel electrode. The present disclosure is not limited by this.

In step S402, a capacitance $C_1$ of a capacitor that is formed by the first conductive region and the second conductive region of the structure that is formed in step S401 can be obtained through measuring the first measurement region and the second measurement region of the structure.

The capacitance C of the capacitor can be calculated through the following formula:

$$C = \varepsilon \cdot \varepsilon_0 \cdot \frac{S}{d} \quad (1)$$

wherein $\varepsilon$ and $\varepsilon_0$ represent relative dielectric constant and vacuum dielectric constant respectively, S represents an overlapped area of the two plates of the capacitor, and d represents a distance between the two plates of the capacitor.

According to the present embodiment, since the structure formed in step S401 is the same as the structure of the corresponding part of the sub pixel in the array substrate, the relative dielectric constant $\varepsilon$, vacuum dielectric constant $\varepsilon_0$, and the distance d of the structure are the same as those of the sub pixel respectively. Therefore, when the capacitance $C_1$ of the capacitor that is formed by the first conductive region and the second conductive region of the structure is obtained, the capacitance $C_x$ of the capacitor that is formed by the pixel electrode and the capacitor electrode of the sub pixel can be calculated through the following formula according to an overlapped area $S_1$ of the first conductive region and the second conductive region of the structure and an overlapped area $S_2$ of the pixel electrode and the capacitor electrode of the sub pixel:

$$C_x = \frac{C_1 \cdot S_2}{S_1} \quad (2)$$

Therefore, according to the method provided by the present embodiment, in step S403, the overlapped area $S_1$ of the first conductive region and the second conductive region of the structure is obtained; and in step S404, the overlapped area $S_2$ of the pixel electrode and the capacitor electrode of the sub pixel is obtained.

At last, in step S405, the capacitance $C_x$ of the capacitor that is formed by the pixel electrode and the capacitor electrode of the sub pixel can be calculated through the above formula (2) according to the capacitance $C_1$ obtained in step S402, the overlapped area $S_1$ obtained in step S403, and the overlapped area $S_2$ obtained in step S404.

A color filter layer is arranged between the pixel electrode and the capacitor electrode of the sub pixel. Therefore, as to the array substrate with a certain type, the capacitance of the capacitor that is formed by the pixel electrode and the capacitor electrode of the sub pixel relates only to the dielectric constant of the color filter layer. A functional relation exists between the dielectric constant of the color filter layer and the temperature, and thus the temperature during producing procedures can be monitored through measuring the capacitance of the capacitor that is formed by the pixel electrode and the capacitor electrode of the sub pixel.

Of course, according to other embodiments of the present disclosure, in the structure that is formed in step S401, the first conductive region can also be arranged in the same layer as the common electrode of the sub pixel. In this case, the capacitance of the capacitor that is formed by the pixel electrode and the common electrode of the sub pixel can be obtained. The present disclosure is not limited by this.

It can be seen from the above description that, according to the method for obtaining capacitance in an array substrate provided by the present embodiment, the structure which is the same as the structure of the sub pixel in the array substrate is formed on a pre-determined position of the liquid crystal display panel, whereby the capacitance of the capacitor of the corresponding part of the sub pixel can be determined through measuring the capacitance of the capacitor that is formed by the structure. The measurement of the capacitance of the capacitor of the sub pixel in the liquid crystal display panel can be realized through the method, thereby providing data basis for analyzing the performance parameters and production status of the liquid crystal display panel.

It could be understood that, the embodiments disclosed herein are not limited by the specific structures, treatment steps or materials disclosed herein, but incorporate the equivalent substitutes of these features which are comprehensible to those skilled in the art. It could be also understood that, the terms used herein are used for describing the specific embodiments, not for limiting them.

The phrases "one embodiment" or "embodiments" referred to herein mean that the descriptions of specific features, structures and characteristics in combination with the embodiments are included in at least one embodiment of the present disclosure. Therefore, the phrases "one embodiment" or "embodiments" appeared in different parts of the whole description do not necessarily refer to the same embodiment.

For the purpose of convenience, a plurality of items, structural units, component units and/or materials used herein can be listed in a common list. However, the list shall be understood in a way that each element thereof represents an only and unique member. Therefore, when there is no other explanation, none of members of the list can be understood as an actual equivalent of other members in the same list only based on the fact that they appear in the same list. In addition, the embodiments and examples of the present disclosure can be explained with reference to the substitutes of each of the components. It could be understood that, the embodiments, examples and substitutes herein shall not be interpreted as the equivalents of one another, but shall be considered as separate and independent representatives of the present disclosure.

In addition, the features, structures and characteristics described herein can be combined with one another in any other suitable way in one embodiment or a plurality of embodiments. The specific details, such as lengths, widths and shapes, described herein are used for providing a comprehensive understanding of the embodiments of the present disclosure. However, it is understandable for those skilled in the art that, the present disclosure may be implemented in other ways different from the specific details specified herein, or may be implemented in other methods, components and materials. The structures, materials and operations known to all are not shown or described in the examples to avoid blurring various aspects of the present disclosure.

The embodiments are described hereinabove to interpret the principles of the present disclosure in one application or a plurality of applications. However, a person skilled in the art, without departing from the principles and thoughts of the present disclosure, can make various modifications to the forms, usages and details of the embodiments of the present disclosure without any creative work. Therefore, the protection scope of the present disclosure shall be determined by the claims.

The invention claimed is:

1. A structure for obtaining capacitance in an array substrate, comprising:
  a first conductive region, arranged in a same layer as a first conductive layer of said array substrate;
  a second conductive region, arranged in a same layer as a second conductive layer of said array substrate, wherein said second conductive region overlaps with said first conductive region partly or totally;
a first measurement region, connected with said first conductive region; and
a second measurement region, connected with said second conductive region,
wherein said first measurement region and said first conductive region are arranged in a same layer, and/or said second measurement region and said second conductive region are arranged in a same layer.

2. The structure according to claim 1, wherein said first conductive layer is a conductive layer where a capacitor electrode is arranged and said second conductive layer is a conductive layer where a pixel electrode is arranged.

3. The structure according to claim 1, wherein said first conductive layer is a conductive layer where a common electrode is arranged and said second conductive layer is a conductive layer where a pixel electrode is arranged.

4. The structure according to claim 1, wherein said second measurement region is arranged in a same layer as said first measurement region and connected with said second conductive region through a via hole.

5. The structure according to claim 1, wherein said first conductive region and/or said second conductive region have/has a round shape.

6. The structure according to claim 1, wherein said first measurement region and said second measurement region have a same geometric dimension.

7. The structure according to claim 1, wherein said first measurement region and said second measurement region are separated from each other by a pre-determined distance.

8. The structure according to claim 1,
wherein a first matching network is arranged between said first conductive region and said first measurement region; and/or
wherein a second matching network is arranged between said second conductive region and said second measurement region.

9. A method for obtaining capacitance in an array substrate, comprising the following steps:
forming a structure on said array substrate, said structure comprising:
a first conductive region, arranged in a same layer as a first conductive layer of said array substrate;
a second conductive region, arranged in a same layer as a second conductive layer of said array substrate, wherein said second conductive region overlaps with said first conductive region partly or totally;
a first measurement region, connected with said first conductive region; and
a second measurement region, connected with said second conductive region,
wherein said first measurement region and said first conductive region are arranged in a same layer, and/or said second measurement region and said second conductive region are arranged in a same layer;
obtaining a capacitance of a capacitor that is formed by the first conductive region and the second conductive region of said structure through measuring the first measurement region and the second measurement region of said structure; and
obtaining a capacitance of a capacitor that is formed by a pixel electrode and a common electrode or a capacitor electrode of a sub pixel through calculation according to the capacitance obtained in the above step and an overlapped area of the first conductive region and the second conductive region, as well as an overlapped area of the pixel electrode and the common electrode or the capacitor electrode of said sub pixel in the array substrate.

10. The method according to claim 9, wherein said first conductive layer is a conductive layer where the capacitor electrode is arranged and said second conductive layer is a conductive layer where the pixel electrode is arranged.

11. The method according to claim 9, wherein said first conductive layer is a conductive layer where the common electrode is arranged and said second conductive layer is a conductive layer where the pixel electrode is arranged.

12. The method according to claim 9, wherein said second measurement region is arranged in a same layer as said first measurement region and connected with said second conductive region through a via hole.

13. The method according to claim 9, wherein said first conductive region and/or said second conductive region have/has a round shape.

14. The method according to claim 9, wherein said first measurement region and said second measurement region have a same geometric dimension.

15. The method according to claim 9, wherein said first measurement region and said second measurement region are separated from each other by a pre-determined distance.

16. The method according to claim 9,
wherein a first matching network is arranged between said first conductive region and said first measurement region; and/or
wherein a second matching network is arranged between said second conductive region and said second measurement region.

17. A structure for obtaining capacitance in an array substrate, comprising:
a first conductive region, arranged in a same layer as a first conductive layer of said array substrate;
a second conductive region, arranged in a same layer as a second conductive layer of said array substrate, wherein said second conductive region overlaps with said first conductive region partly or totally;
a first measurement region, connected with said first conductive region; and
a second measurement region, connected with said second conductive region,
wherein a first matching network is arranged between said first conductive region and said first measurement region, and/or
wherein a second matching network is arranged between said second conductive region and said second measurement region.

18. The structure according to claim 17, wherein said first conductive layer is a conductive layer where a capacitor electrode is arranged and said second conductive layer is a conductive layer where a pixel electrode is arranged.

* * * * *